US012165914B2

United States Patent
Su et al.

(10) Patent No.: US 12,165,914 B2
(45) Date of Patent: Dec. 10, 2024

(54) AIR SPACER SURROUNDING CONDUCTIVE FEATURES AND METHOD FORMING SAME

(71) Applicant: Taiwan Semiconductor Manufacturing Co., Ltd., Hsinchu (TW)

(72) Inventors: Yi-Nien Su, Hsinchu (TW); Yu-Yu Chen, Hsinchu (TW); Kuan-Wei Huang, Taoyuan (TW); Li-Min Chen, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 436 days.

(21) Appl. No.: 17/369,497

(22) Filed: Jul. 7, 2021

(65) Prior Publication Data
US 2022/0310441 A1     Sep. 29, 2022

Related U.S. Application Data

(60) Provisional application No. 63/166,318, filed on Mar. 26, 2021.

(51) Int. Cl.
*H01L 21/768* (2006.01)
*H01L 23/522* (2006.01)
*H01L 23/532* (2006.01)

(52) U.S. Cl.
CPC .... *H01L 21/7682* (2013.01); *H01L 21/76807* (2013.01); *H01L 21/76843* (2013.01);
(Continued)

(58) Field of Classification Search
CPC .......... H01L 21/7682; H01L 21/76807; H01L 21/76843; H01L 21/7685; H01L 21/76897;
(Continued)

(56) References Cited

U.S. PATENT DOCUMENTS 7,560,375 B2 *   7/2009   Filippi .............. H01L 21/76807
                                                    438/618
7,803,713 B2 *   9/2010   Chen ................... H01L 21/0206
                                                    438/704
(Continued)

FOREIGN PATENT DOCUMENTS

KR   20140123639 A   10/2014
KR   20190087843 A   7/2019

*Primary Examiner* — Jaehwan Oh
*Assistant Examiner* — John M Parker
(74) *Attorney, Agent, or Firm* — Slater Matsil, LLP

(57) ABSTRACT

A method includes etching a dielectric layer to form an opening. A first conductive feature underlying the dielectric layer is exposed to the opening. A sacrificial spacer layer is deposited to extend into the opening. The sacrificial spacer layer is patterned. A bottom portion of the sacrificial spacer layer at a bottom of the opening is removed to reveal the first conductive feature, and a vertical portion of the sacrificial spacer layer in the opening and on sidewalls of the dielectric layer is left to form a ring. A second conductive feature is formed in the opening. The second conductive feature is encircled by the ring, and is over and electrically coupled to the first conductive feature. At least a portion of the ring is removed to form an air spacer.

20 Claims, 20 Drawing Sheets

(52) U.S. Cl.
CPC ...... *H01L 21/7685* (2013.01); *H01L 23/5226* (2013.01); *H01L 23/53295* (2013.01)

(58) Field of Classification Search
CPC ......... H01L 29/66545; H01L 29/66795; H01L 23/5226; H01L 23/53295
See application file for complete search history.

(56) References Cited

U.S. PATENT DOCUMENTS

| | | | |
|---|---|---|---|
| 9,401,329 B2* | 7/2016 | Chen | H01L 21/76816 |
| 9,514,980 B2 | 12/2016 | Lee et al. | |
| 10,199,325 B2* | 2/2019 | Yim | H01L 23/5228 |
| 10,410,916 B2* | 9/2019 | Hong | H01L 21/76835 |
| 11,508,615 B2* | 11/2022 | Huang | H01L 23/5329 |
| 11,551,968 B2* | 1/2023 | Hsueh | H01L 23/5329 |
| 2003/0183940 A1 | 10/2003 | Noguchi et al. | |
| 2011/0215477 A1* | 9/2011 | Chen | H01L 23/522 |
| | | | 438/618 |
| 2012/0276711 A1 | 11/2012 | Yoon et al. | |
| 2014/0306351 A1 | 10/2014 | Kim | |
| 2015/0332999 A1* | 11/2015 | Ting | H01L 21/76816 |
| | | | 438/618 |
| 2017/0179241 A1 | 6/2017 | Chang et al. | |
| 2018/0174961 A1 | 6/2018 | Ting et al. | |
| 2022/0028780 A1* | 1/2022 | Huang | H01L 23/5226 |

\* cited by examiner

AIR SPACER SURROUNDING CONDUCTIVE FEATURES AND METHOD FORMING SAME

PRIORITY CLAIM AND CROSS-REFERENCE

This application claims the benefit of the following provisionally filed U.S. patent application: Application No. 63/166,318, filed on Mar. 26, 2021, and entitled "Metal Air Spacer Patterning," which application is hereby incorporated herein by reference.

BACKGROUND

Integrated circuit devices such as transistors are formed on semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias in a low-k dielectric layer, the low-k dielectric layer is etched to form trenches and via openings. The etching of the low-k dielectric layer may involve forming a patterned hard mask over the low-k dielectric material, and using the patterned hard mask as an etching mask to form trenches. Via openings are also formed underlying the trenches. The trenches and the via openings are then filled with a metallic material, which may comprise copper. A Chemical Mechanical Polish (CMP) process is then performed to remove excess portions of the metallic material over the low-k dielectric layer.

Air spacers are known to have a low k value, which is equal to 1.0. In conventional processes for forming air spacers between metal lines, the dielectric material between two metal lines is removed first, followed by re-depositing another dielectric material between the two metal lines. The deposition process is controlled so that an air spacer is formed in the refilled dielectric material. A CMP process is then performed to remove excess portions of the filled dielectric material, which excess portions are over the metal lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
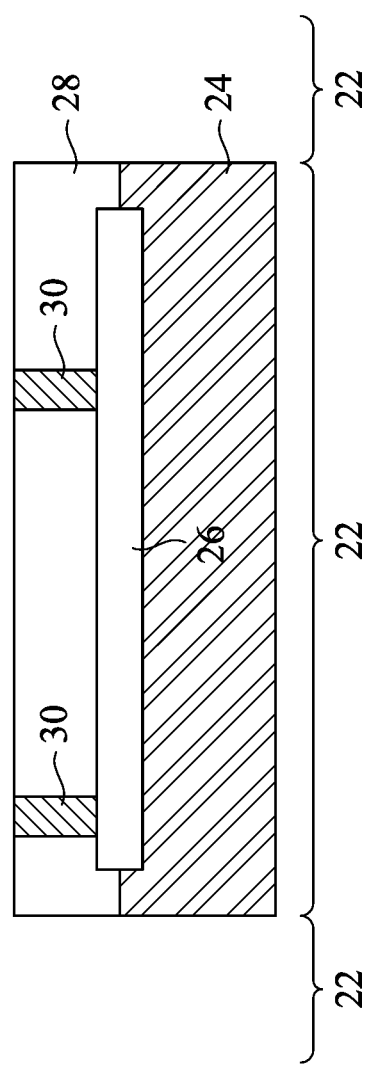
FIGS. 1-8, 9A, 9B, 10-14, and 15A illustrate the cross-sectional views of intermediate stages in the formation of conductive features and air spacers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An air spacer and the method of forming the same are provided. In accordance with some embodiments of the present disclosure, a sacrificial spacer is formed as a ring, and a conductive feature such as a metal line, a metal via, a contact plug, or the like is formed in the space surrounded by the sacrificial spacer. The sacrificial spacer is then removed to leave an air spacer surrounding the conductive feature. The formation of the air spacer in accordance with the embodiments of the present disclosure does not need to remove and then refill dielectric materials, and hence does not need to perform any planarization process, which is a costly process. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-8, 9A, 9B, and 10-14, and 15A illustrate the cross-sectional views of intermediate stages in the formation of conductive features and air spacers in accordance with some embodiments of the present disclosure. The corresponding processes are also reflected schematically in the process flow shown in FIG. 17.

FIG. 1 illustrates a cross-sectional view of package component 20. In accordance with some embodiments of the present disclosure, package component 20 is a device wafer including active devices and possibly passive devices, which are represented by the illustrated integrated circuit devices 26. Device wafer 20 may include a plurality of dies 22 therein, with one of dies 22 illustrated. In accordance with alternative embodiments of the present disclosure, package component 20 is an interposer wafer, which may or may not include active devices and/or passive devices. In subsequent discussion, a device wafer is discussed as an example of package component 20. The embodiments of the present disclosure may also be applied to other types of package components such as interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of crystalline silicon, crystalline germanium, silicon germanium, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may be (or may not be) formed to extend into semiconductor substrate 24, wherein the through-vias are used to electrically inter-couple the features on opposite sides of wafer 20.

Figure 16:
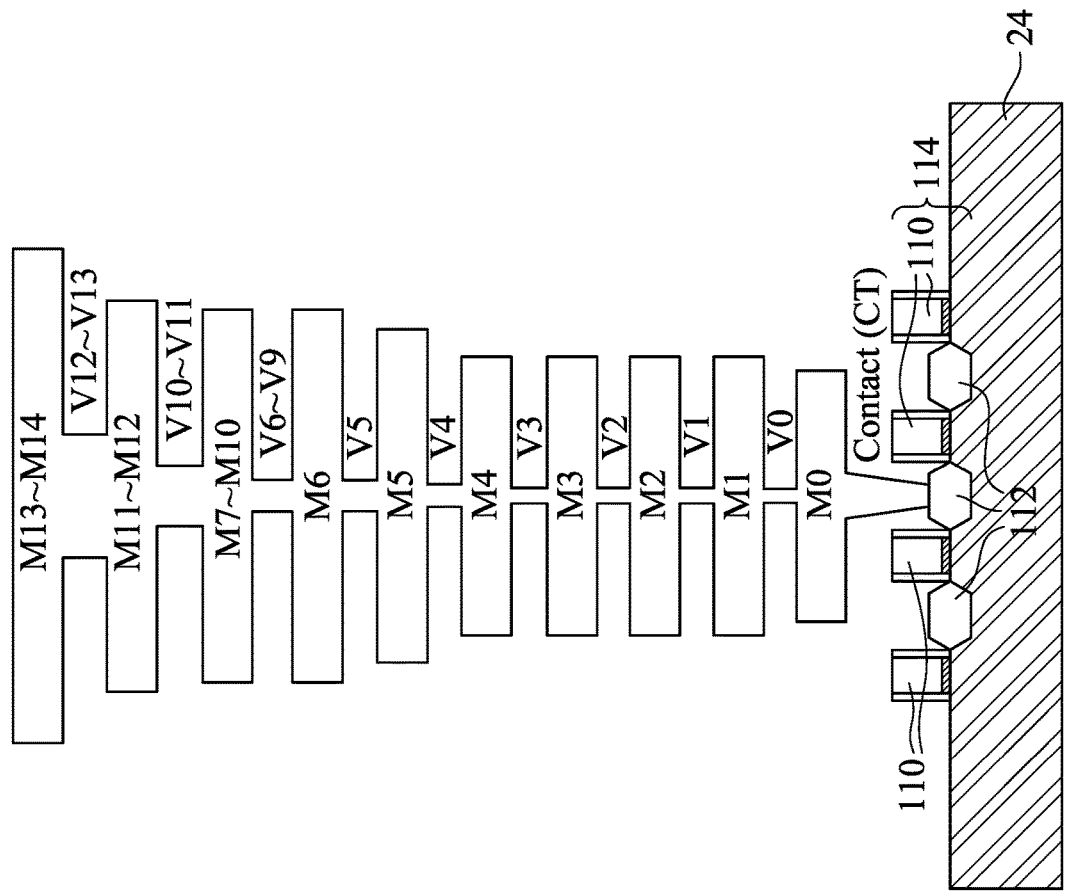
FIG. 16 illustrates the schematic view of layers in a wafer in accordance with some embodiments.

In accordance with some embodiments of the present disclosure, integrated circuit devices 26 are formed at the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated in FIG. 1. FIG. 16 illustrates a schematic view of an example transistor in accordance with some embodiments, which includes gate stacks 110 and source/drain regions 112, which are formed at the top surface of semiconductor substrate 24. In accordance with alternative embodiments, wafer 20 is used for forming interposers, and substrate 24 may be a semiconductor substrate or a dielectric substrate.

Inter-Layer Dielectric (ILD) 28 is formed over semiconductor substrate 24, and fills the space between the gate stacks of transistors (not shown) in integrated circuit devices 26. In accordance with some embodiments, ILD 28 is formed of or comprises Phospho Silicate Glass (PSG), Boro Silicate Glass (BSG), Boron-doped Phospho Silicate Glass (BPSG), Fluorine-doped Silicate Glass (FSG), silicon oxide, or the like. ILD 28 may be formed using spin coating, Flowable Chemical Vapor Deposition (FCVD), or the like. In accordance with some embodiments of the present disclosure, ILD 28 is formed using a deposition process such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process such as a Chemical Mechanical Polish (CMP) process or a mechanical grinding process to level the top surfaces of contact plugs 30 with the top surface of ILD 28.

Figure 2:
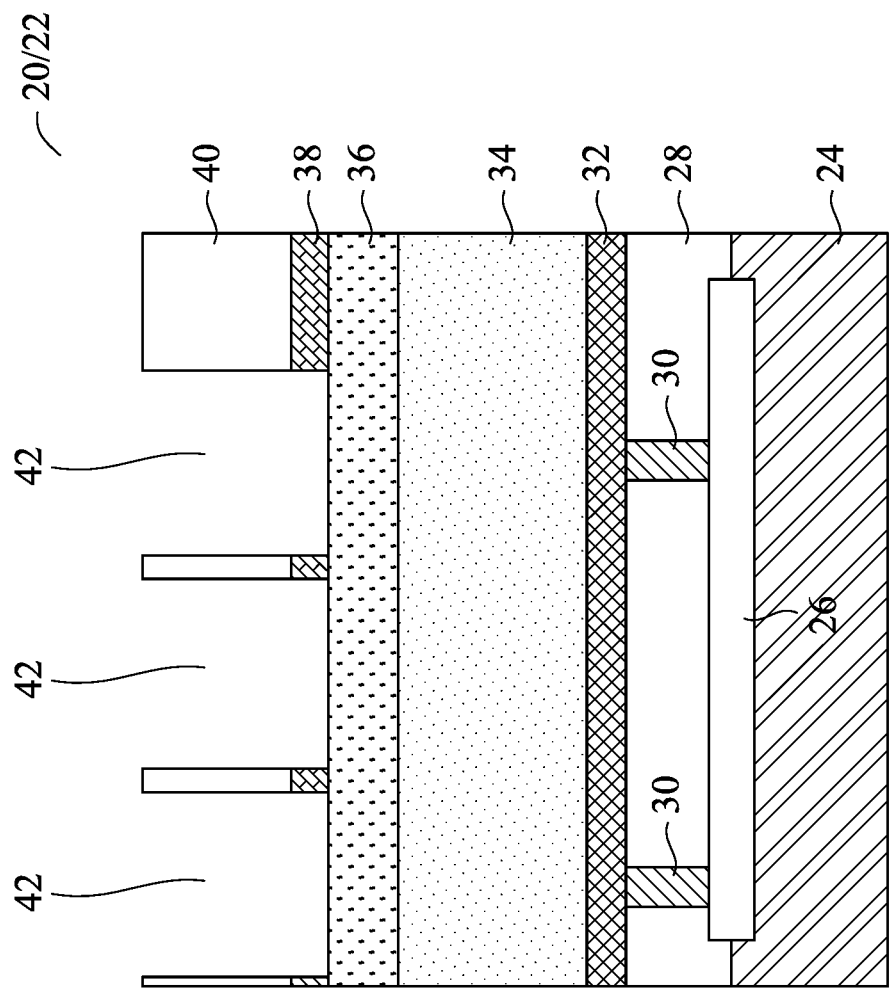
Figure 17:
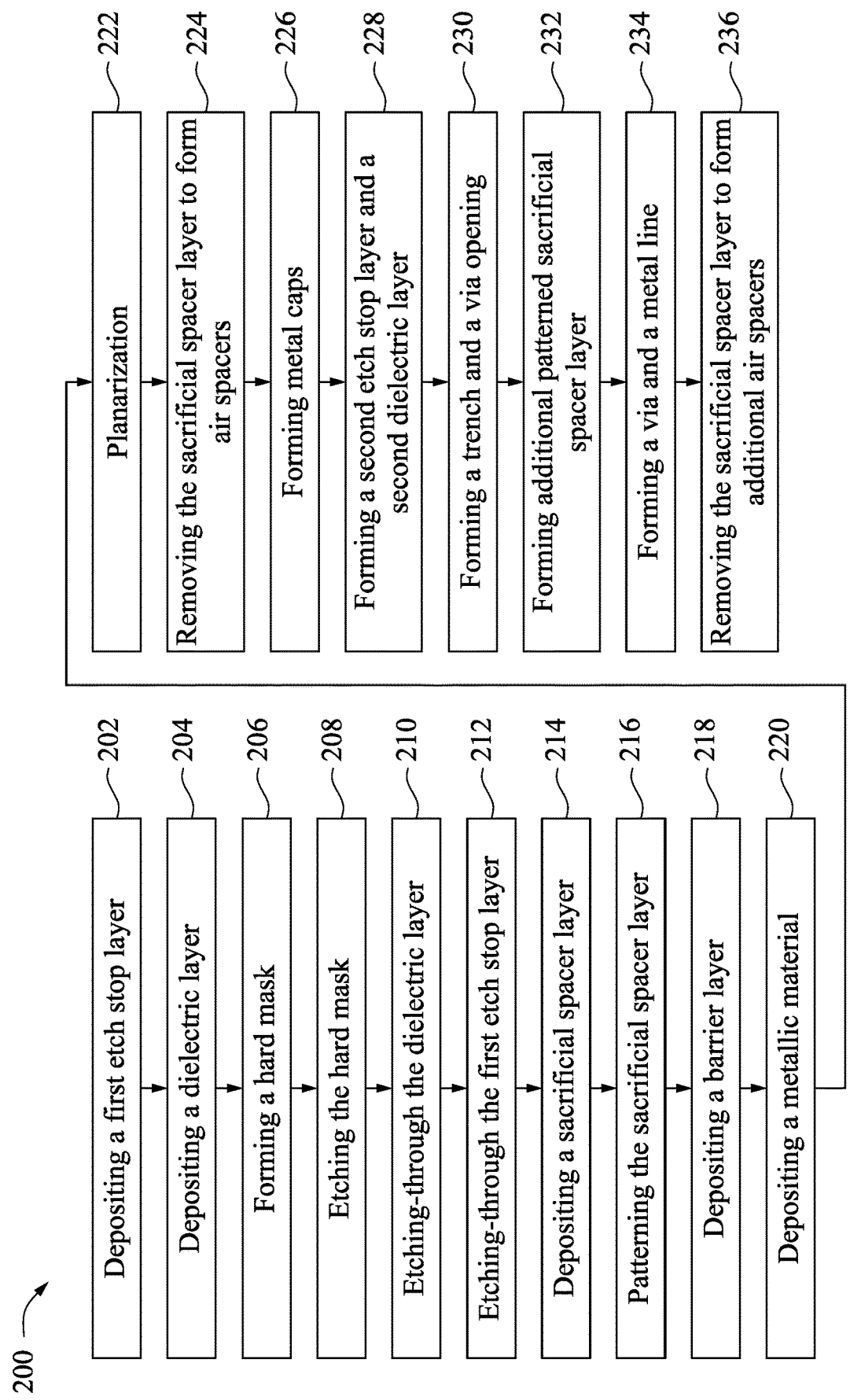
FIG. 17 illustrates a process flow for forming conductive features and air spacers in accordance with some embodiments.

Referring to FIG. 2, etch stop layer 32 is formed over ILD 28 and contact plugs 30. The respective process is illustrated as process 202 in the process flow 200 as shown in FIG. 17. In accordance with some embodiments, etch stop layer 32 is in contact with the top surfaces of ILD 28 and contact plugs 30. In accordance with alternative embodiments, there is one or a plurality of layers and the corresponding features located between ILD 28 and etch stop layer 32. For example, there may be an additional etch stop layer(s), an additional ILD, low-k dielectric layers, etc., between ILD 28 and etch stop layer 32. Correspondingly, there may be contact plugs, vias, metal lines, etc., in the dielectric layers.

Etch stop layer 32 may include silicon nitride (SiN), silicon carbide (SiC), silicon oxy-nitride (SiON), silicon oxy-carbide (SiOC), silicon Carbo-nitride (SiCN), or the like. Etch stop layer 32 may also include a metal oxide, a metal nitride, or the like. Etch stop layer 32 may be a single layer formed of a homogeneous material, or a composite layer including a plurality of dielectric sub-layers formed of different martials. In accordance with some embodiments of the present disclosure, etch stop layer 32 includes an aluminum nitride (AlN) layer, a silicon oxy-carbide layer over the aluminum nitride layer, and an aluminum oxide layer over the silicon oxy-carbide layer.

Further referring to FIG. 2, dielectric layer 34 is deposited over etch stop layer 32. The respective process is illustrated as process 204 in the process flow 200 as shown in FIG. 17. In accordance with some embodiments, dielectric layer 34 is also an ILD layer. In accordance with alternative embodiments, dielectric layer 34 is an Inter-Metal Dielectric (IMD) layer for forming metal lines. In accordance with some embodiments of the present disclosure, dielectric layer 34 is formed of or comprises a low-k dielectric material having a dielectric constant (k value) lower than 3.8, and the dielectric constant may also be lower than about 3.0 such as between about 2.5 and 3.0. Dielectric layer 34 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layer 34 includes depositing a porogen-containing dielectric material, and then performing a curing process to drive out the porogen, and hence the remaining dielectric layer 34 is porous.

Pad layer 36 and hard mask 38 are formed on dielectric layer 34. The respective process is illustrated as process 206 in the process flow 200 as shown in FIG. 17. Pad layer 36 may be a thin film formed of or comprising silicon oxide. In accordance with some embodiments of the present disclosure, pad layer 36 is formed using Tetraethyl orthosilicate (TEOS) as a precursor, and the deposition process may include PECVD, CVD, or the like. Pad layer 36 acts as an adhesion layer between dielectric layer 34 and hard mask 38. Pad layer 36 may also act as an etch stop layer for etching hard mask 38. In accordance with some embodiments of the present disclosure, hard mask 38 is formed of silicon nitride, for example, using Low-Pressure Chemical Vapor Deposition (LPCVD). In accordance with other embodiments of the present disclosure, hard mask 38 is formed of or comprises titanium nitride, boron nitride, or the like, which may be formed through PECVD, for example. Hard mask 38 is used as a hard mask during subsequent photolithography processes.

Further referring to FIG. 2, photo resist 40 is formed on hard mask 38 and is then patterned, forming openings 42 in photo resist 40. In a subsequent process, photo resist 40 is used to etch hard mask layer 36. The respective process is illustrated as process 208 in the process flow 200 as shown in FIG. 17. Pad layer 36 may act as the etch stop layer for the etching process. Accordingly, pad layer 36 is exposed.

After the etching process, photo resist 40 is removed, for example, in an ashing process.

Figure 3:
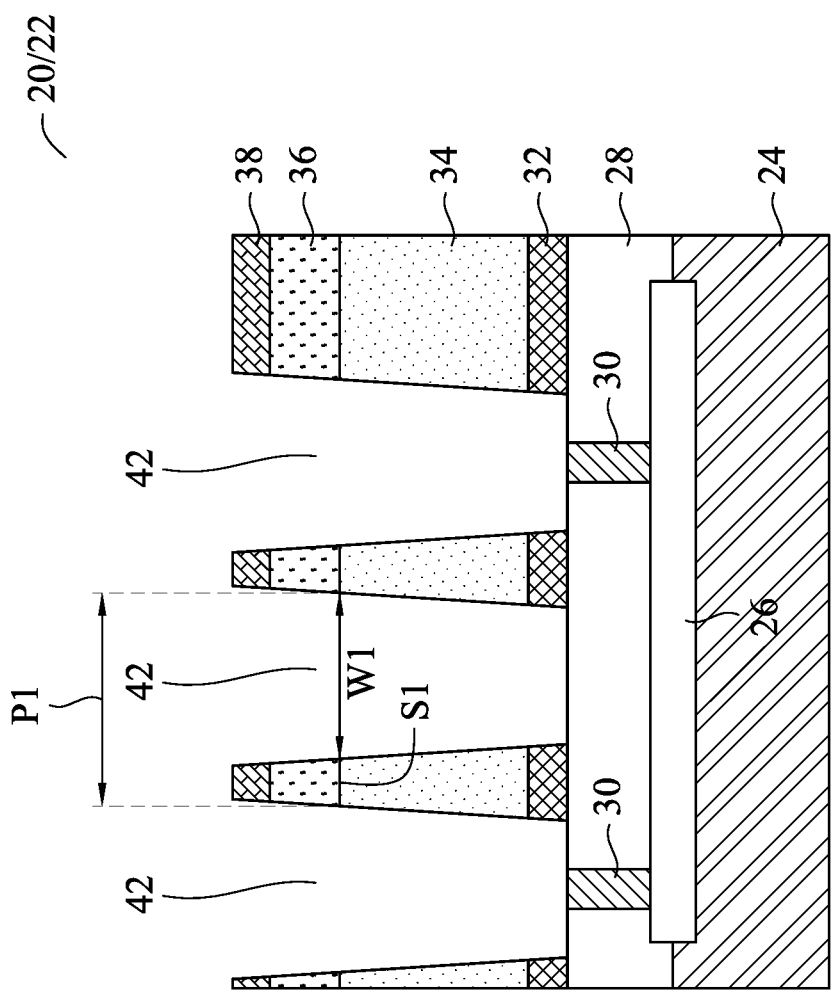

Next, referring to FIG. 3, pad layer 36 and dielectric layer 34 are etched using hard mask 38 as an etching mask, and openings 42 extend into dielectric layer 34. The respective process is illustrated as process 210 in the process flow 200 as shown in FIG. 17. The pad layer 36 may be etched through a dry etching process by using a mixture of $NF_3$ and $NH_3$ gases, the mixture of HF and $NH_3$ gases, or the like. Alternatively, pad layer 36 may be etched through a wet etching process by using, for example, an HF solution. In accordance with some embodiments of the present disclosure, the etching of dielectric layer 34 is performed using a process gas comprising fluorine and carbon, wherein fluorine is used for etching, with carbon having the effect of protecting the sidewalls of the dielectric layer 34, with the sidewalls facing via openings and trenches. For example, the process gases for the etching include a fluorine and carbon containing gas(es) such as $C_4F_8$, $CH_2F_2$, $CH_4$, $CH_3F$, and/or $CF_4$, and a carrier gas such as Ar, $N_2$, or the like. The etching is anisotropic.

The etching of dielectric layer 34 stops on etch stop layer 32. Next, etch stop layer 32 is etched-through, and openings 42 further penetrate through etch stop layer 32. The respective process is illustrated as process 212 in the process flow 200 as shown in FIG. 17. The etching chemical is selected according to the materials and the layers of etch stop layer 32. For example, when etch stop layer 32 comprises aluminum oxide, silicon oxycarbide, aluminum nitride, etc., etching gases such as $BCl_3$, $Cl_2$, $CF_4$, $CHF_3$, etc. may be used, and oxygen ($O_2$) may be added. After the etching of dielectric layer 34, the underlying conductive features (such as contact plugs 30 when etch stop layer 32 is immediately over contact plugs 30) are revealed.

In accordance with some embodiments, openings 42 have widths W1, and the spacing between neighboring openings 42 is S1, wherein width W1 and spacing S1 are measured at the top surface of dielectric layer 34. Neighboring openings 42 have pitch P1, which is also the pitch of the subsequently filled conductive features (such as metal lines). In accordance with some embodiments, width W1 is in the range between about 9 nm and about 30 nm, spacing S1 is in the range between about 3 nm and about 10 nm, and pitch P1 is in the range between about 12 nm and about 40 nm.

Figure 4:
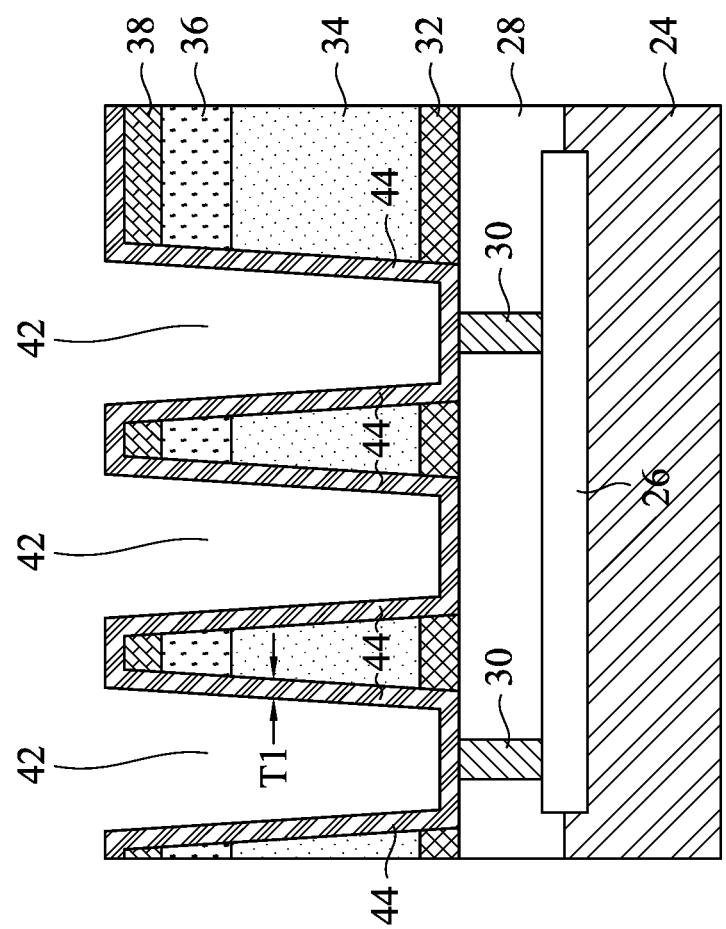

FIG. 4 illustrates the deposition of sacrificial spacer layer 44. The respective process is illustrated as process 214 in the process flow 200 as shown in FIG. 17. In accordance with some embodiments, sacrificial spacer layer 44 is formed of or comprises a semiconductor such as Si, or a dielectric material such as titanium oxide (TiOx), aluminum oxide (AlOx), silicon nitride, or the like. The thickness T1 of sacrificial spacer layer 44 is determined by the desirable width of the intended air spacers, and may be in the range between about 1 nm and about 10 nm. The deposition may be performed through a conformal deposition process such as CVD, ALD, Physical Vapor Deposition (PVD), or the like.

It is appreciated that the width W1, spacing S1, pitch P1, thickness T1, etc. are related to the position of dielectric layer 34. For example, when dielectric layer 34 is a lower IMD layer such as the layer for metallization layer M0, M1, etc., width W1, spacing S1, pitch P1, and thickness T1 may be smaller, and when dielectric layer 34 is a higher IMD layer such as the layer for metallization layer M8, M9 or higher, width W1, spacing S1, pitch P1, and thickness T1 may be greater.

Figure 5:
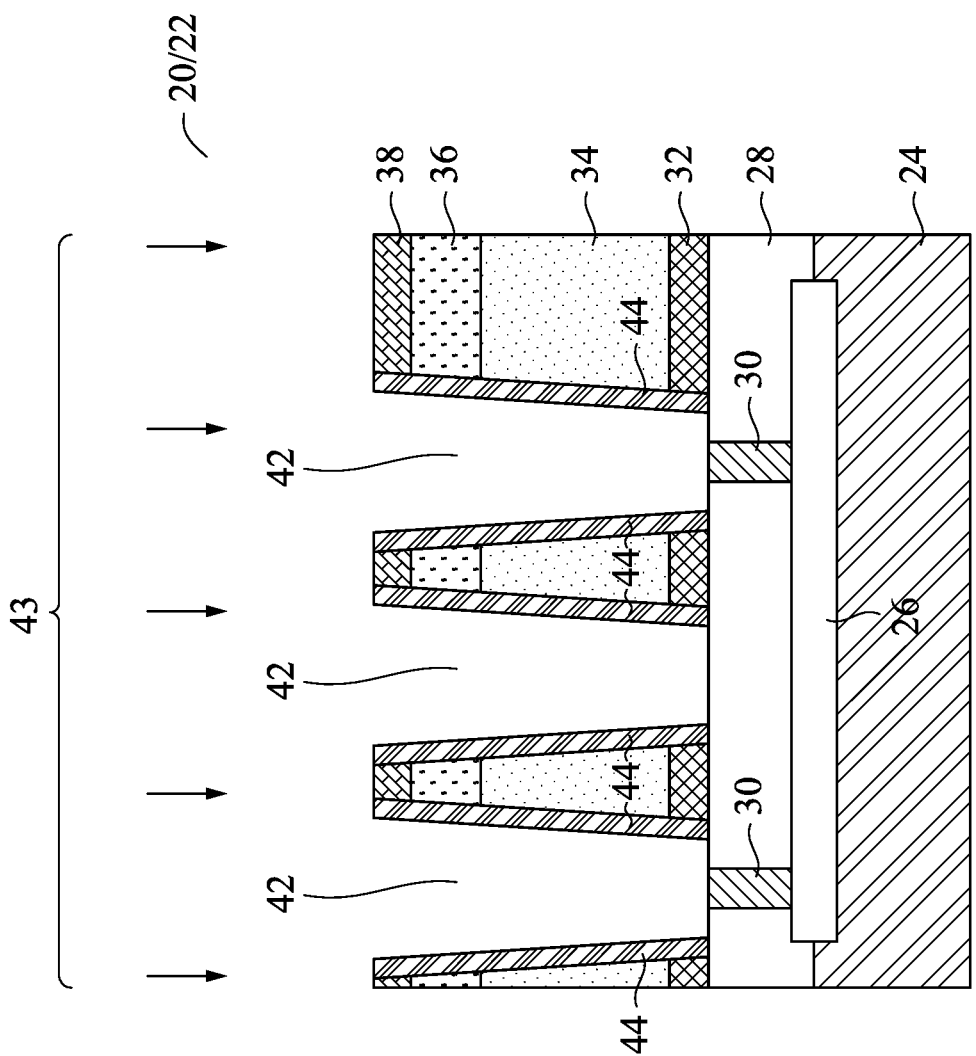

FIG. 5 illustrates an anisotropic etching process for patterning sacrificial spacer layer 44. The respective process is illustrated as process 216 in the process flow 200 as shown in FIG. 17. In accordance with some embodiments, the etching is performed through a dry etching process, wherein the etching gas may include $Cl_2$, $CF_4$, $CHF_3$, $CH_4$, HBr, $O_2$, etc., depending on the material of the sacrificial spacer layer 44. As a result of the anisotropic etching process, the horizontal portions of sacrificial spacer layer 44 are removed. Furthermore, at the bottoms of openings 42, conductive features 30 are exposed. The vertical portions of sacrificial spacer layer 44 are left in openings 42, and are on the sidewalls of etch stop layer 32, dielectric layer 34, pad layer 36, and hard mask 38.

Figure 6:
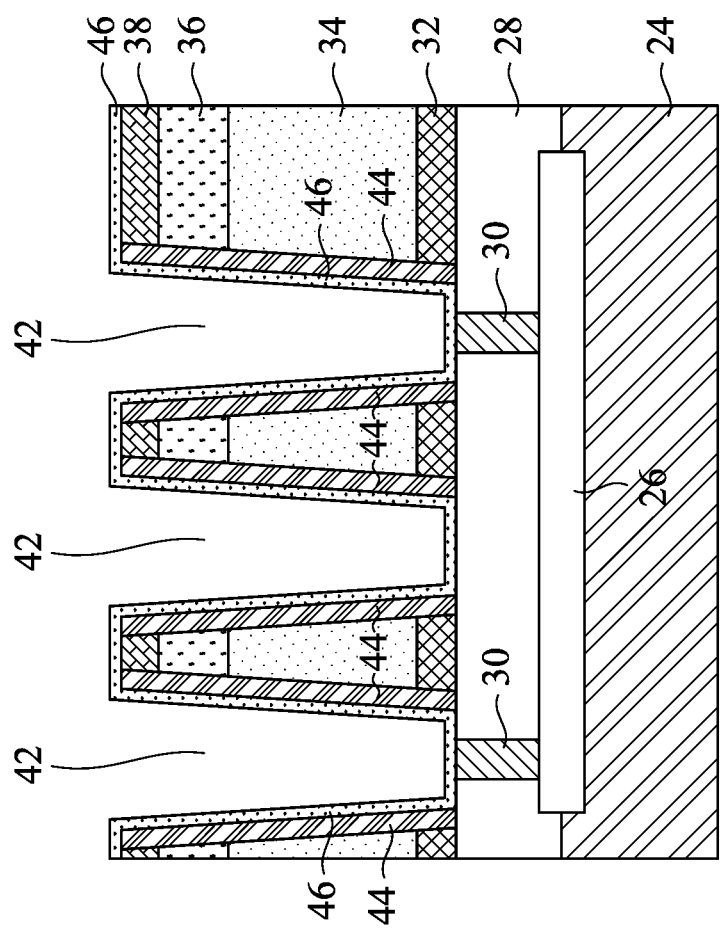
Figure 7:
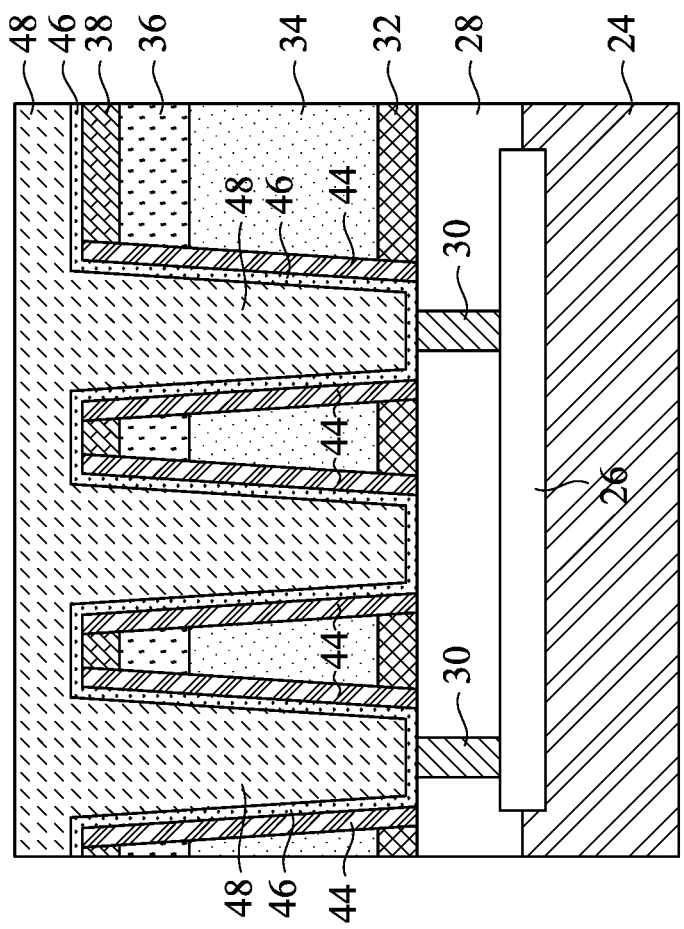
Figure 8:
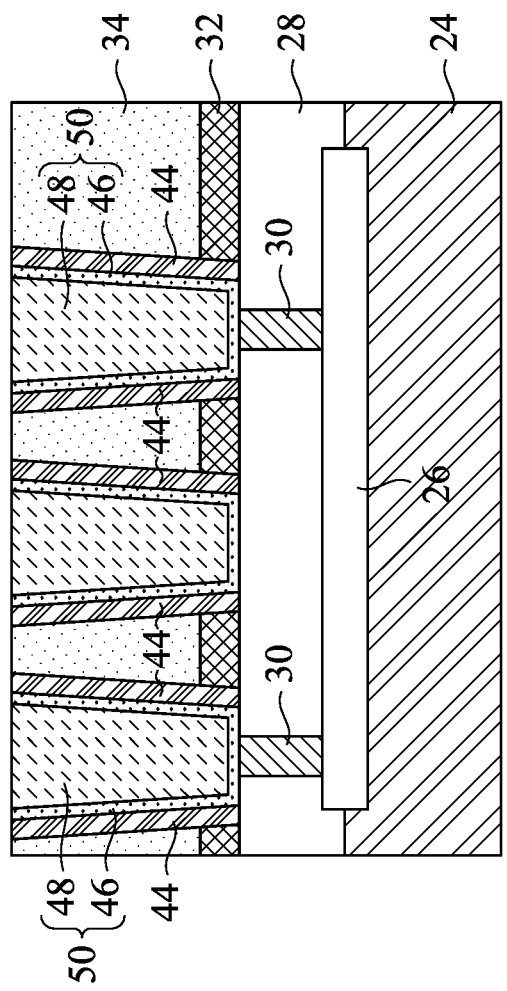

FIGS. 6 through 8 illustrate the formation of conductive features 50 (FIG. 8). Referring to FIG. 6, barrier layer 46 is formed. The respective process is illustrated as process 218 in the process flow 200 as shown in FIG. 17. In accordance with some embodiments, barrier layer 46 is formed of or comprises titanium, titanium nitride, tantalum, tantalum nitride, or the like. Barrier layer 46 may be formed as a conformal layer, which may be formed using CVD, ALD, PVD, or the like. After the formation of barrier layer 46, a metal seed layer (not shown) is formed. The metal seed layer may be formed of or comprise copper, and may be formed, for example, using PVD.

FIG. 7 illustrates the deposition of conductive material 48. The respective process is illustrated as process 220 in the process flow 200 as shown in FIG. 17. In accordance with some embodiments, conductive material 48 comprises copper or a copper alloy, cobalt, tungsten, aluminum, or the like, or combinations thereof. The deposition process may include Electro Chemical Plating (ECP), electroless plating, CVD, or the like. Conductive material 48 fully fills openings 42.

Next, a planarization process such as a Chemical Mechanical Polish (CMP) process or a mechanical grinding process is performed to remove excess portions of the conductive material 48 and barrier layer 46. The respective process is illustrated as process 222 in the process flow 200 as shown in FIG. 17. The planarization process may be stopped on the top surface of dielectric layer 34, or on the top surface of pad layer 36. The planarization process may also be performed to remove a top portion of dielectric layer 34. The resulting structure is shown in FIG. 8. Throughout the description, the remaining portions of conductive material 48 and barrier layer 46 are collectively referred to as conductive features 50, which may be metal lines, metal vias, contact plugs, etc. Spacer rings 44 surround the corresponding conductive features 50.

Figure 9A:
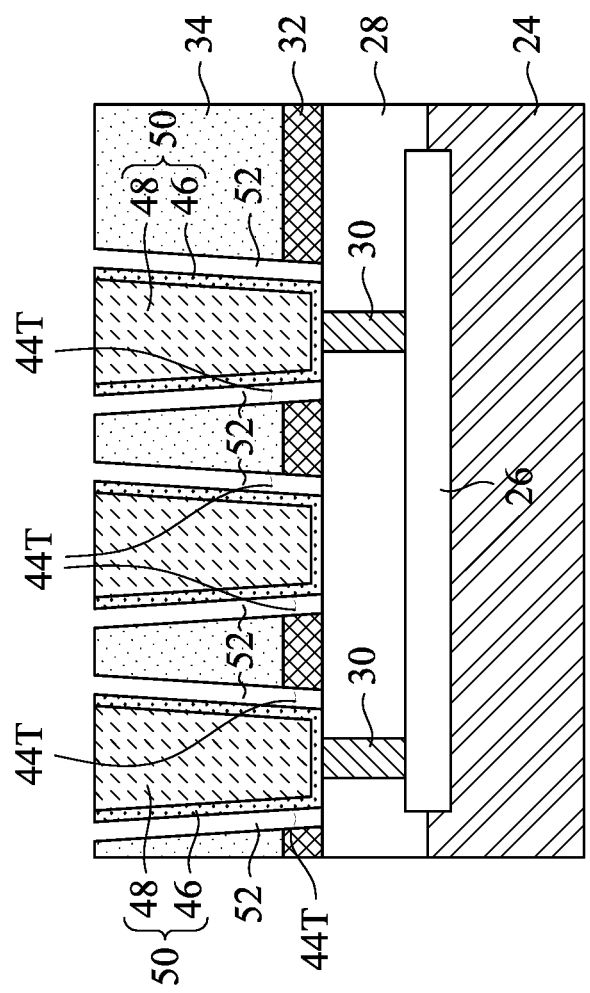

FIG. 9A illustrates the removal of sacrificial spacer layers 44 to form air spacers 52. The respective process is illustrated as process 224 in the process flow 200 as shown in FIG. 17. Air spacers 52 have substantially uniform thickness (lateral dimension) due to the conformity of sacrificial spacer layer 44, for example, with the thicknesses of most parts of an air spacer having a variation smaller than about 20 percent. In accordance with some embodiments, sacrificial spacer layer 44 is etched using an isotropic etching process, which may include a dry etching process and/or a wet etching process. For example, when a dry etching process is performed, the etching gas may include HF, $NF_3$, $O_2$, $H_2$, $NH_3$, $Cl_2$, $CF_4$, $CHF_3$, $CH_4$, HBr, or the like, or combinations thereof, depending on the material of the sacrificial spacer layer 44. When a wet etching process is performed, the etching chemical may include a HF solution, ammonia water ($NH_4OH$), or the like.

In accordance with some embodiments, sacrificial spacer layer 44 is fully removed, and air spacers 52 extend to the top surface of the underlying dielectric layer (such as ILD 28, depending on the position of dielectric layer 34). It is also possible that the process variation and the high aspect ratio of air spacers 52 may cause sacrificial spacer layer 44 to be partially removed. For example, the bottom portions of sacrificial spacer layer 44 may remain un-removed after the removal process, and dashed lines 44T represent the top surfaces of the residue of sacrificial spacer layer 44. The residue portions of sacrificial spacer layer 44 may form a full ring encircling conductive features 50. Also due to process variation and the non-uniformity in the removal, the sacrificial spacer layer 44 surrounding some of the conductive features 50 may be fully removed, while the sacrificial spacer layer 44 surrounding some other conductive features 50 may have residues left. Furthermore, there may be some portions of the corresponding sacrificial spacer layer 44 fully removed, and the underlying ILD 28 exposed, while some other portions of the same sacrificial spacer layer 44 surrounding the same conductive feature 50 are left as residue sacrificial spacer layer. An example is schematically illustrated in FIG. 9A, which shows that residue sacrificial spacer layer 44 exists on the left side of the rightmost conductive feature 50, while the portion of sacrificial spacer layer 44 on the right side of the rightmost conductive feature 50 is fully removed. Also, the different portions of residue sacrificial spacer layer 44 surrounding the same conductive feature 50 or different conductive features 50 may have their top surfaces at different levels, as indicated in the examples as shown in FIG. 9A. It is appreciated that the above-discussed air spacers 52 and residue sacrificial spacer layer 44 may exist on the same wafer and same die 22.

Figure 10:
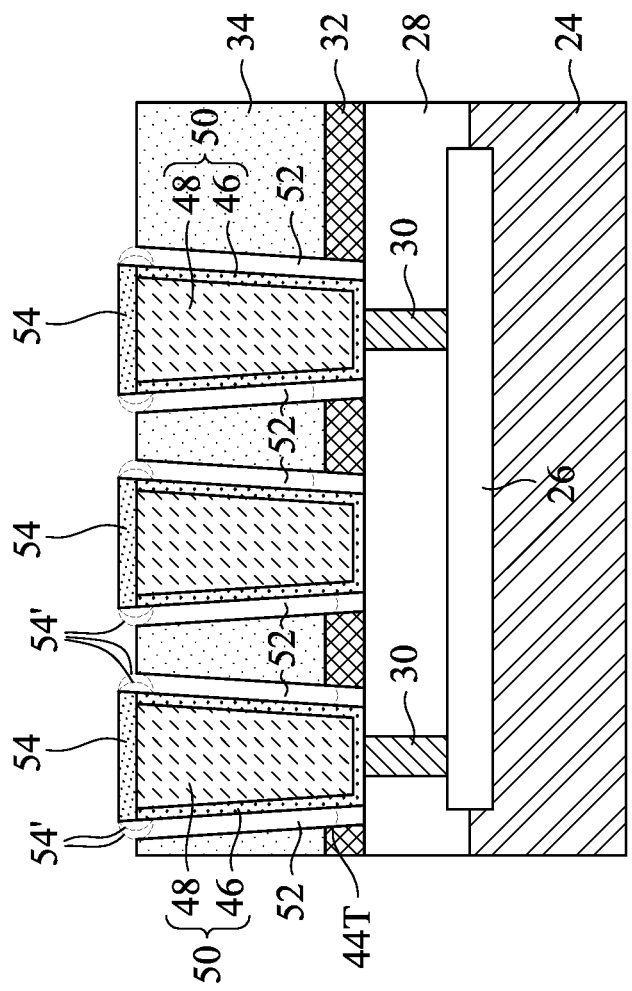

FIG. 10 illustrates the formation of metal caps 54. The respective process is illustrated as process 226 in the process flow 200 as shown in FIG. 17. In accordance with some embodiments, metal caps 54 are formed through a selective depositing process, so that metal caps 54 are selectively deposited on the exposed surfaces of conductive features 50, and not on the exposed surfaces of dielectric materials such as sacrificial spacer layer 44 and dielectric layer 34. In accordance with some embodiments, the selective deposition process may be performed through ALD or CVD. In accordance with some embodiments, metal caps 54 are formed of or comprise cobalt (Co), tungsten (W), CoWP, CoB, tantalum (Ta), nickel (Ni), molybdenum (Mo), titanium (Ti), iron (Fe), or combinations thereof. When metal caps 54 are deposited, the precursor may include a metal halide (such as $WCl_5$) or a metal organic material and a reducing agent such as $H_2$. The deposition process may be a thermal process performed at an elevated temperature, such as in the range between about 275° C. and about 500° C. The deposition may also be performed with plasma turned on. In accordance with some embodiments, the reaction formula is $MX+H_2 \rightarrow M+HX$, wherein M represents the metal, and MX represents the metal halide such as WC's.

In accordance with some embodiments, metal caps 54 are limited in the regions directly over conductive features 50. Metal caps 54 may or may not include portions extending sideways slightly to form overhangs. The overhangs contact the top portions of the sidewalls of conductive features 50, which sidewalls face air spacers 52. For example, FIG. 10 schematically illustrates dashed lines 54', which represent the extension portions of metal caps 54. The extension portions 54' of metal caps 54 may extend into the top portions of air spacers 52. Furthermore, extension portions 54' may be spaced part from dielectric layer 34, or may extend far enough to contact the nearest portion of dielectric layer 34. Accordingly, metal caps 54 may leave air spacers 52 opened, or may partially or fully seal air spacers 52.

Figure 9B:
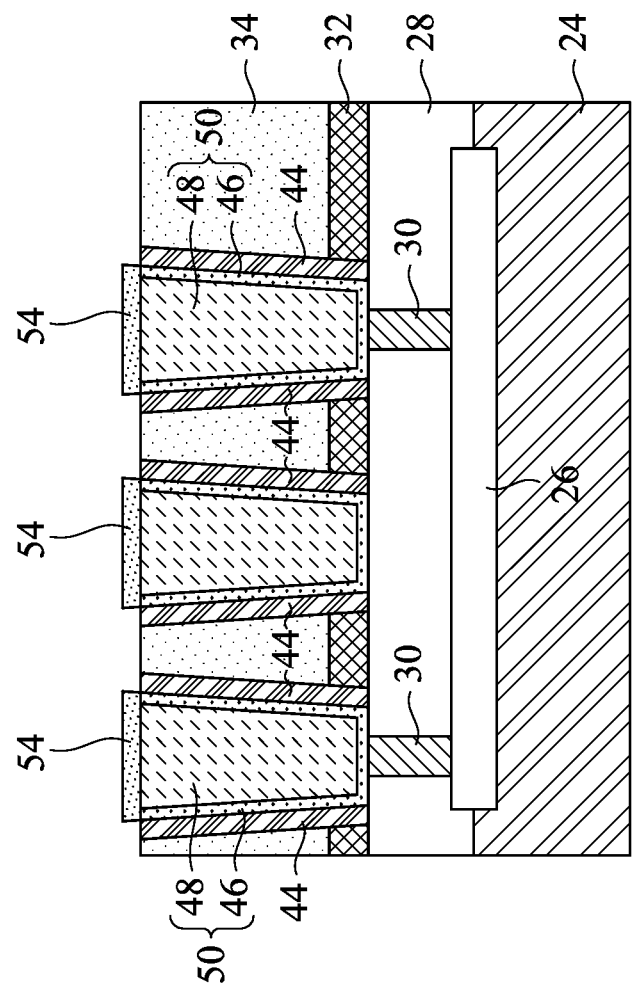

FIGS. 9A and 10 in combination disclose an embodiment in which air spacers 52 are formed first, followed by the formation of metal caps 54. In accordance with alternative embodiments, metal caps 54 are formed first, followed by the removal of sacrificial spacer layer 44 to form air spacers 52. This embodiment is shown in FIGS. 9B and 10 in combination. Referring to FIG. 9B, metal caps 54 are deposited. The deposition process is controlled, for example, by controlling the thickness of metal caps 54, so that the lateral extensions of metal caps 54 do not extend on the top of sacrificial spacer layer 44 excessively. After the formation of metal caps 54, there are enough parts of the top surface of sacrificial spacer layer 44 remaining exposed. After the formation of metal caps 54, sacrificial spacer layer 44 is removed. The resulting structure is also shown in FIG. 10. In accordance with these embodiments, however, the entirety of metal caps 54 is higher than the top surface of dielectric layer 34, and metal caps 54 do not extend into air spacers 52.

Air spacers 52 have k values equal to 1.0, which is smaller than other dielectric materials, even low-k dielectric materials. With the formation of air spacers, the parasitic capacitance between neighboring conductive features 50 is reduced.

Figure 11:
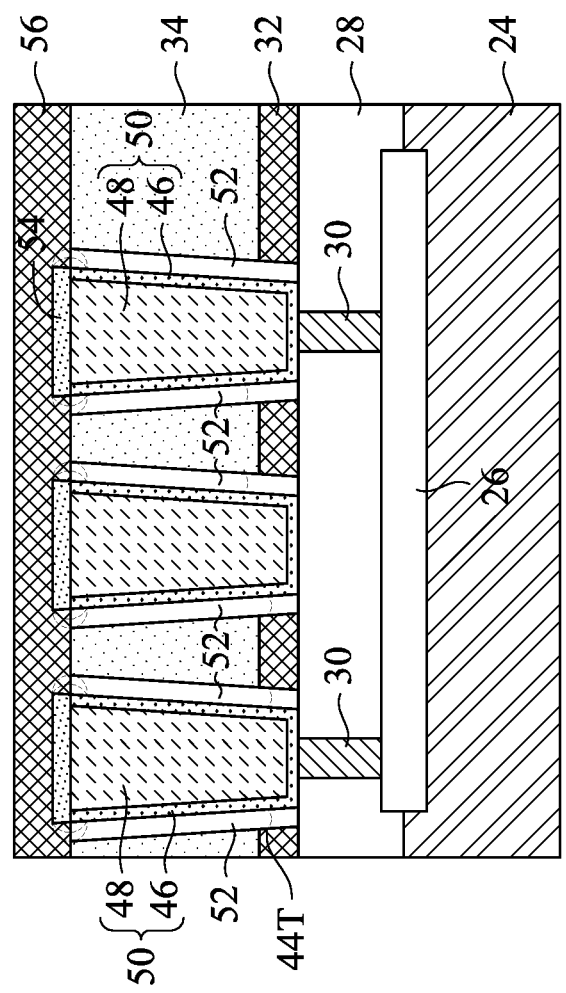

FIG. 11 illustrates the formation of etch stop layer 56. The respective process is illustrated as process 228 in the process flow 200 as shown in FIG. 17. Etch stop layer 56 contacts metal caps 54, and seals air spacer 52 (if not sealed already). In accordance with some embodiments, etch stop layer 56 may be formed of a material selected from SiN, SiC, SiON, SiOC, SiCN, or combinations thereof. Etch stop layer 56 may also include a metal oxide, a metal nitride, or the like. Etch stop layer 56 may be a single layer formed of a homogeneous material, or a composite layer including a plurality of dielectric sub-layers. In accordance with some embodiments of the present disclosure, etch stop layer 56 includes an AlN layer, a SiOC layer over the AlN layer, and an AlO layer over the SiOC layer.

Figure 12:
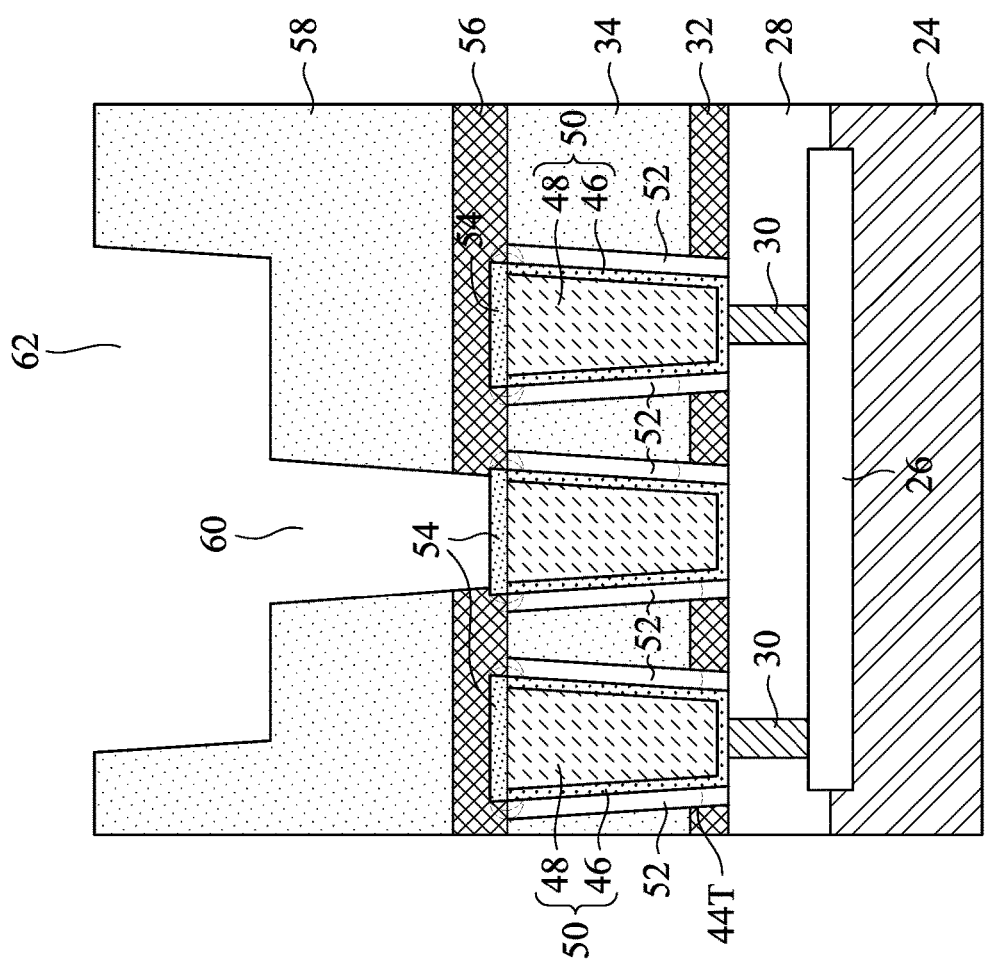
Figure 13:
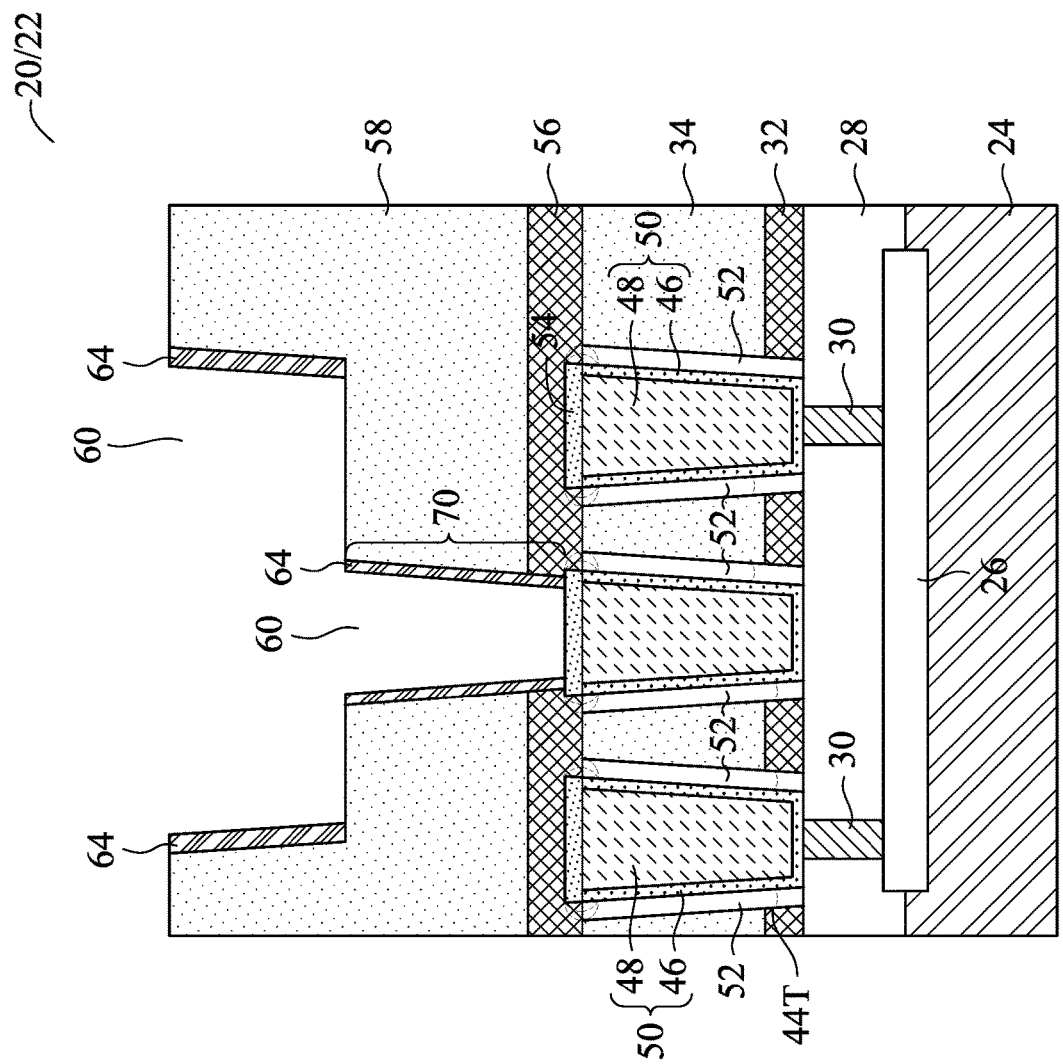
Figure 14:
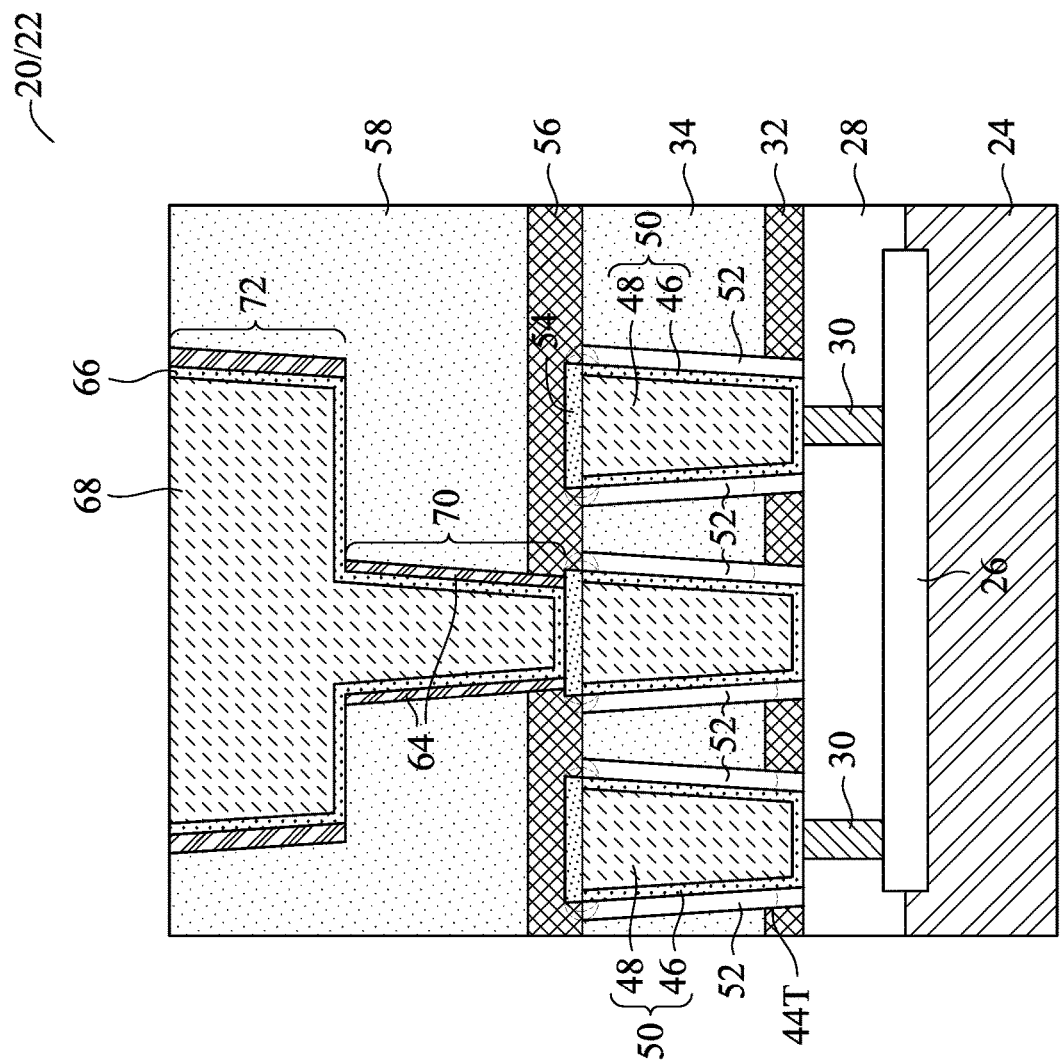

FIGS. 12 through 14 illustrate the formation of a dual damascene structure in accordance with some embodiments. Referring to FIG. 12, dielectric layer 58 is deposited. The respective process is also illustrated as process 228 in the process flow 200 as shown in FIG. 17. Dielectric layer 58 may be formed of a low-k dielectric material, which may be selected from the same group of candidate materials for forming dielectric layer 34. Trench 62 and via opening 60 are formed in dielectric layer 58. The respective process is illustrated as process 230 in the process flow 200 as shown in FIG. 17. In accordance with some embodiments of the present disclosure, a metal hard mask (not shown) is formed and patterned to define the patterns of trench 62. A photo lithography process is performed to etching dielectric layer 58 in order to form a via opening. The via opening extends from the top surface of dielectric layer 58 to an intermediate level between the top surface and the bottom surface of dielectric layer 58. An anisotropic etching is then performed to etch dielectric layer 58 and to form trench 62 using the metal hard mask as an etching mask. At the same time trench 62 are formed, the via opening extends downwardly to metal cap 54, hence forming via opening 60. The etching for forming trench 62 may be performed using a time-mode. In accordance with alternative embodiments, via openings 60 and trenches 62 are formed in separate photo lithography processes. For example, in a first photo lithography process, via openings 60 are formed extending down to metal cap 54. In a second lithography process, trench 62 is formed. Metal cap 54 is then exposed to via opening 60.

Referring to FIG. 13, a patterned sacrificial spacer layer 64 is formed. The respective process is illustrated as process 232 in the process flow 200 as shown in FIG. 17. The formation process of sacrificial spacer layer 64 includes depositing a conformal layer, and then performing an anisotropic etching process to remove horizontal portions of the conformal layer. The materials and the process details are similar to what have been discussed referring to FIGS. 4 and 5, and are not repeated herein. Sacrificial spacer layer 64 includes first vertical portions in trench 62 to form a first ring, and second vertical portions in via opening 60 to form a second ring. The first ring is larger than the second ring, and is disconnected from the second ring.

Next, referring to FIG. 14, diffusion barrier 66 and metallic material 68 are deposited. The materials and the formation processes are similar to what have been discussed referring to FIGS. 6 through 8, and the details are not repeated herein. After the deposition of diffusion barrier 66 and metallic material 68, a planarization process is performed, forming via 70 and metal line 72. The respective process is illustrated as process 234 in the process flow 200 as shown in FIG. 17. Each of via 70 and metal line 72 is encircled by a spacer ring formed of a part of sacrificial spacer layer 64.

Figure 15A:
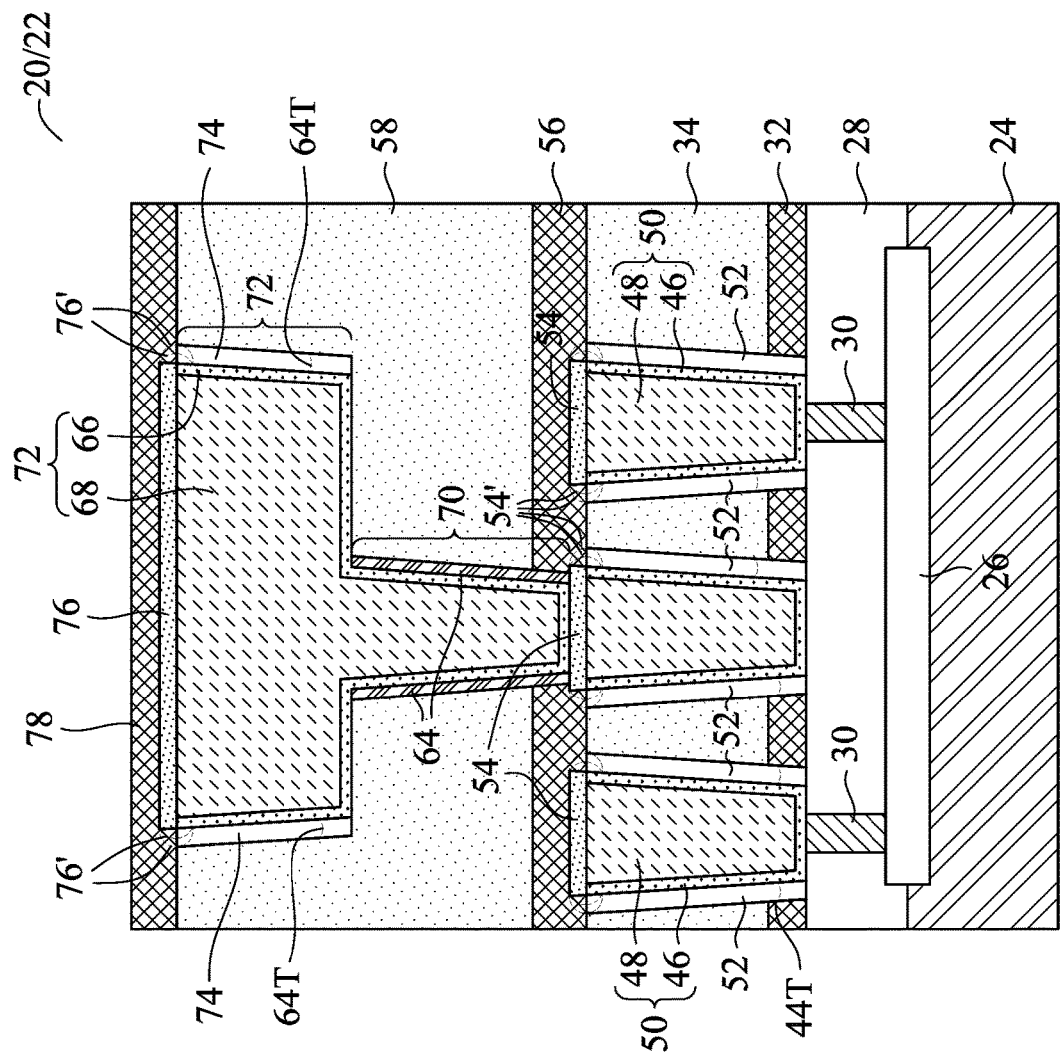

FIG. 15A illustrates the removal of sacrificial spacer layer 64 from the sidewall of metal line 72, forming air spacers 74, which form a ring when viewed from top of wafer 20. The respective process is illustrated as process 236 in the process flow 200 as shown in FIG. 17. The removal may also be performed through an isotropic etching process. The resulting air spacers 74 may extend to, and may be exposed to, the top surface of the underlying portion of dielectric layer 58. There may be, and may not be, residue sacrificial spacer layer 64 left, wherein the top surfaces of the example residue sacrificial spacer layer 64 are shown as 64T. Furthermore, due to process variation and loading effect, the residue sacrificial spacer layer 64 may have similar situations as residue sacrificial spacer layer 44 as discussed preceding paragraphs. For example, some parts of sacrificial spacer layer 44 may have more residues left than other parts, and some parts of sacrificial spacer layer 44 may not have residue left. The possible scenarios may be found referring to the discussion of air spacers 52.

Since the part of sacrificial spacer layer 64 encircling via 70 cannot be removed, these parts of sacrificial spacer layer 64 will be left in the final structure. It is appreciated that these parts of sacrificial spacer layer 64 will result in increased parasitic capacitance compared to air spacers and low-k dielectric material. Vias 70, however, are laterally short, and are most likely to have longer distance from neighboring vias. Accordingly, the adverse increase in the parasitic capacitance is small compared to the reduction in parasitic capacitance due to the formation of air spacers 74. Alternatively stated, the reduction in the parasitic capacitance more than offsets the increase in the parasitic capacitance.

FIG. 15A further illustrates the formation of metal cap 76, which may be formed of a material and a method selected from the same group of candidate materials and candidate methods, respectively, for forming metal caps 54. Metal cap 76 may be formed before or after the formation of air spacers 74, which is similar to the embodiments as shown in FIGS. 9A and 9B. Also, when metal cap 76 is formed after the formation of air spacers 74, extension portions 76' may be formed and extend below the top surface of dielectric layer 58. Alternatively, when metal cap 76 is formed before the formation of air spacers 74, an entirety of sacrificial spacer layer 64, including the extension portions 76' that is directly over air spacers 74, will not extend below the top surface of dielectric layer 58. Etch stop layer 78 may then be deposited.

Figure 15B:
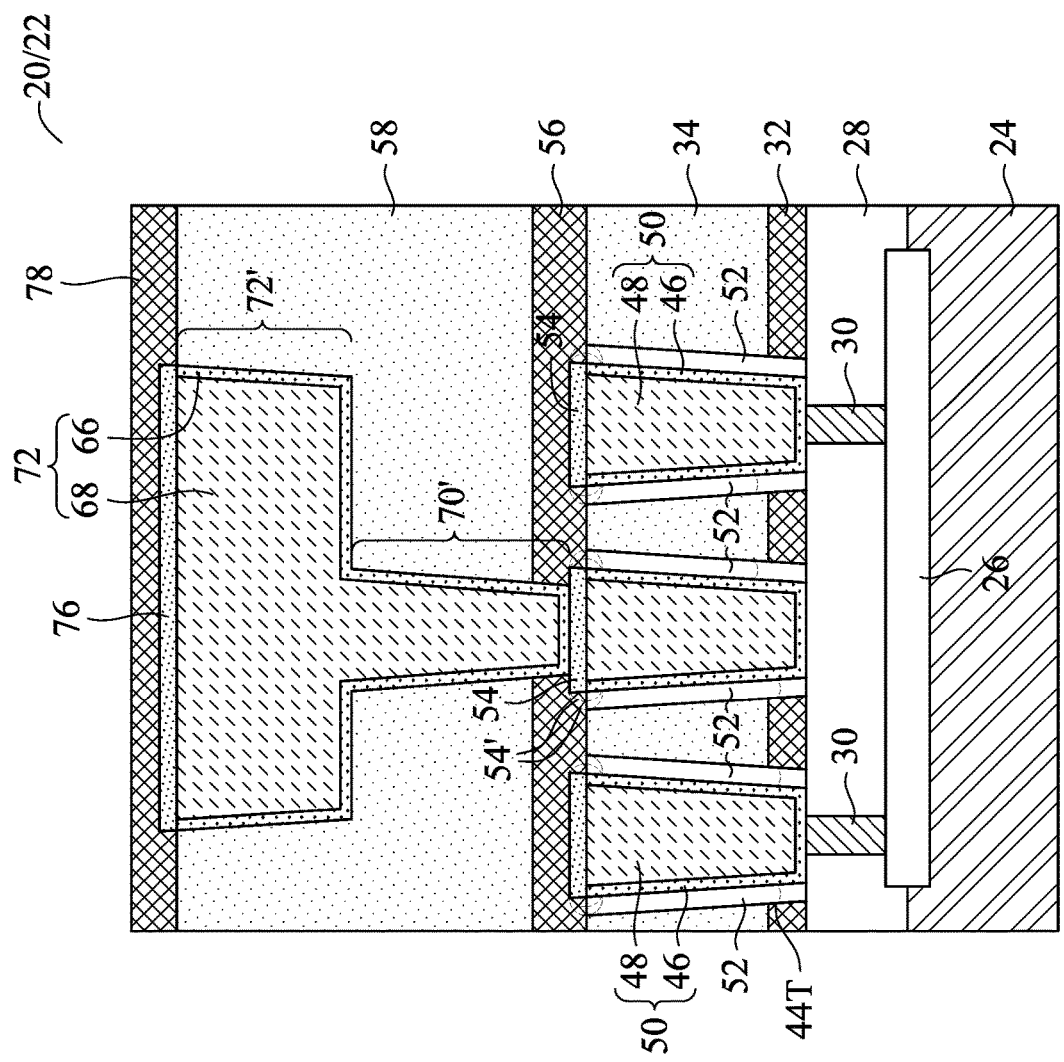
FIG. 15B illustrates the cross-sectional view of a dual damascene structure without being surrounded by any air spacer in accordance with some embodiments.

FIG. 15B illustrates the formation of air-gap-free via 70' and metal line 72' in accordance with alternative embodiments. These embodiments are similar to the embodiments as shown in FIG. 15A, except that no sacrificial spacer layer is formed, and accordingly, no air spacers are formed. Via 70' and metal line 72' are thus in physical contact with the sidewalls of the surrounding dielectric layer 58. It is appreciated that although FIG. 15B illustrates that air-gap-free via 70' and metal line 72' are formed immediately over conductive features, in accordance with alternative embodiments, the air spacer 74 as shown in FIG. 15A may be formed in a dielectric layer immediately over dielectric layer 34, while the air-gap-free via 70' and metal line 72' are formed in layers over the layer in which air spacer 74 is formed since parasitic capacitance problem is less severe in upper metal layers than in lower metal layers.

Figure 15C:
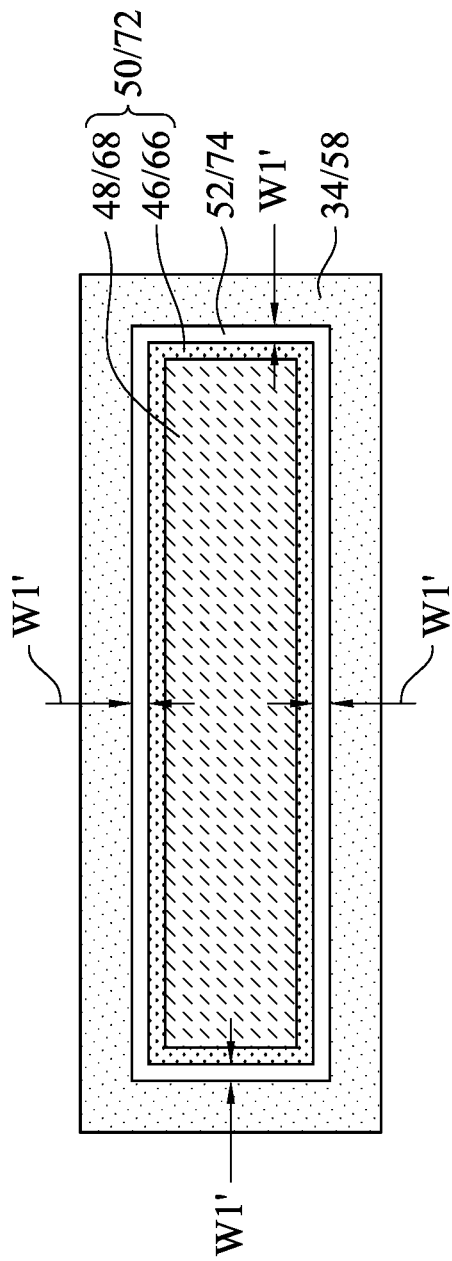
FIG. 15C illustrates a top view of an air spacer in accordance with some embodiments.

FIG. 15C illustrates a top view of air spacer 52 or 74 in accordance with some embodiments. As shown in FIG. 15C, each of air spacers 52 and 74 may form a full ring encircling the corresponding conductive feature 50/72. Each of air spacers 52 and 74 may have a substantially uniform width W1' (for example, with variation being smaller than about 10 percent). The width W1' may be measured at the middle height of the corresponding air spacers 52 and 74. The width W1' of air spacer 52 may be the same as or different from the width W1' of air spacer 74. Furthermore, when viewed from a cross-sectional view, air spacer 52 has a substantially uniform width (for example, with variation smaller than about 20 percent or smaller than about 10 percent) from top to bottom, and air spacer 74 has a substantially uniform width (for example, with variation smaller than about 20 percent or smaller than about 10 percent) from top to bottom.

FIG. 16 illustrates the scheme of the possible layers of conductive features in wafer 20 (die 22). Transistor 114 is formed at the top surface of semiconductor substrate 24, and transistor 114 represents the integrated circuit devices 26 as shown in FIGS. 15A and 15B. Transistor 114 includes gate stacks 110 and source/drain regions 112. Over transistor 114, there is a contact (CT) layer, in which contact plugs 30 (FIGS. 15A and 15B) are formed. Metal layer M0, which may include metal lines therein, are formed over contact layer. There are also a plurality of metal layers such as M1 through M14 and via layers such as V1 through V13 formed. These layers may be formed using single damascene processes or dual damascene processes. Air spacers may be formed aside the metal features in any of these layers in any combination. When air spacers are formed in the layers that are formed using single damascene processes, the processes as shown in FIGS. 4-8, 9A, 9B and 10-11 may be adopted. When air spacers are formed in the layers that are formed using dual damascene processes, the processes as shown in FIGS. 12 through 15A may be adopted. In accordance with some embodiments, lower layers such as metal layers M0, M1, M2, etc., may have air spacers formed since the conductive features in the lower layers are spaced close to each other, and hence parasitic capacitance is likely to be more severe. Upper layers such as metal layers M14, M13, M12, etc., may have no air spacers formed since the conductive features in the upper layers are spaced farther away from each other, and hence parasitic capacitance is likely to be less severe. In accordance with some embodiments, there is a threshold metal layer (such as M3, M4, or M5), and air spacers are formed in the threshold metal layer and some (or all) of the metal layers under the threshold metal layer. No air spacer, however, is formed in any of the metal layers over the threshold metal layer.

The embodiments of the present disclosure have some advantageous features. By forming air spacers, the parasitic capacitance between neighboring conductive features may be reduced. In addition, the formation of air spacers does not include refilling and planarizing dielectric material, and the manufacturing cost is reduced.

In accordance with some embodiments of the present disclosure, a method comprises etching a dielectric layer to form an opening, wherein a first conductive feature underlying the dielectric layer is exposed to the opening; depositing a sacrificial spacer layer extending into the opening; patterning the sacrificial spacer layer, wherein a bottom portion of the sacrificial spacer layer at a bottom of the opening is removed to reveal the first conductive feature, and a first vertical portion of the sacrificial spacer layer in the opening and on sidewalls of the dielectric layer is left to form a first ring; forming a second conductive feature in the opening, wherein the second conductive feature is encircled by the first ring, and is over and electrically coupled to the first conductive feature; and removing at least a portion of the first ring to form an air spacer. In an embodiment, the sacrificial spacer layer is deposited as a conformal layer. In an embodiment, the method further comprises forming a metal capping layer over the second conductive feature, wherein the metal capping layer comprises an extension portion extending into the air spacer. In an embodiment, the method further comprises a metal capping layer over the second conductive feature, wherein the first ring is removed after the metal capping layer is formed. In an embodiment, the forming the second conductive feature comprises forming a contact plug. In an embodiment, the forming the second conductive feature comprises forming a metal line. In an embodiment, the sidewalls of the dielectric layer facing the opening are substantially straight and extend from a top surface to a bottom surface of the dielectric layer. In an embodiment, the opening comprises a trench and a via opening underlying the trench, and the first ring is in the trench, and the patterning the sacrificial spacer layer further forms a second ring in the via opening. In an embodiment, at a time after the first ring is formed, the second ring remains. In an embodiment, the method further comprises forming an additional dielectric layer over the sacrificial spacer layer and sealing the air spacer, wherein a residue portion of the first ring is left underlying the additional dielectric layer. In an embodiment, the first ring is fully removed.

In accordance with some embodiments of the present disclosure, a structure comprises a first conductive feature; a first etch stop layer over the first conductive feature; a dielectric layer over the first etch stop layer; a second conductive feature in the dielectric layer and the first etch stop layer, wherein the second conductive feature is over and contacting the first conductive feature; an air spacer encircling the second conductive feature, wherein sidewalls of the second conductive feature are exposed to the air spacer; and a second etch stop layer over and contacting the dielectric layer, wherein the second etch stop layer is further over the second conductive feature. In an embodiment, the air spacer has a substantially uniform horizontal dimension. In an embodiment, the air spacer extends from a top surface to a bottom surface of the first etch stop layer. In an embodiment, the structure further comprises a dielectric material underlying and contacting a sidewall of a bottom portion of the second conductive feature, wherein a top portion of the second conductive feature is exposed to the air spacer. In an embodiment, the dielectric material forms a ring encircling the bottom portion of the second conductive feature, and the dielectric material and the dielectric layer are formed of different materials. In an embodiment, no dielectric material is between the second conductive feature and the air spacer.

In accordance with some embodiments of the present disclosure, a structure comprises a first conductive feature; a second conductive feature over and electrically coupling to the first conductive feature, wherein the second conductive feature comprises a diffusion barrier; and a metallic material in a basin formed by the diffusion barrier; an air spacer encircling a top portion of the second conductive feature; and a dielectric layer encircling the air spacer. In an embodiment, the structure further comprises a dielectric material separating a bottom portion of the second conductive feature from the dielectric layer, wherein the dielectric material is directly underlying and exposed to the air spacer. In an embodiment, the air spacer has a substantially uniform width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a dielectric layer to form an opening, wherein a first conductive feature underlying the dielectric layer is exposed to the opening;
   depositing a sacrificial spacer layer extending into the opening;
   patterning the sacrificial spacer layer, wherein a bottom portion of the sacrificial spacer layer at a bottom of the opening is removed to reveal the first conductive feature, and a first vertical portion of the sacrificial spacer layer in the opening and on sidewalls of the dielectric layer is left to form a first ring;
   forming a second conductive feature in the opening, wherein the second conductive feature is encircled by the first ring, and is over and electrically coupled to the first conductive feature;
   removing at least a portion of the first ring to form an air spacer; and
   forming a metal capping layer over the second conductive feature, wherein the metal capping layer comprises an extension portion extending into the air spacer.

2. The method of claim 1, wherein the sacrificial spacer layer is deposited as a conformal layer.

3. The method of claim 1, wherein the first ring is removed after the metal capping layer is formed.

4. The method of claim 1, wherein the forming the second conductive feature comprises forming a contact plug.

5. The method of claim 1, wherein the forming the second conductive feature comprises forming a metal line.

6. The method of claim 1, wherein the sidewalls of the dielectric layer facing the opening are substantially straight and extend from a top surface to a bottom surface of the dielectric layer.

7. The method of claim 1, wherein the opening comprises a trench and a via opening underlying the trench, and the first ring is in the trench, and the patterning the sacrificial spacer layer further forms a second ring in the via opening.

8. The method of claim 7 further comprising depositing an etch stop layer over the second conductive feature, wherein at a time after the etch stop layer is deposited, the second ring remains.

9. The method of claim 1 further comprising forming an additional dielectric layer over the sacrificial spacer layer and sealing the air spacer, wherein a residue portion of the first ring is left underlying the additional dielectric layer.

10. The method of claim 1, wherein the first ring is fully removed.

11. A method comprising:
depositing a first etch stop layer over a first conductive feature;
depositing a dielectric layer over the first etch stop layer;
forming a second conductive feature in the dielectric layer and the first etch stop layer, wherein the second conductive feature is over and contacting the first conductive feature;
forming an air spacer encircling the second conductive feature, wherein at least middle portions of sidewalls of the second conductive feature are exposed to the air spacer;
forming a metal cap on the second conductive feature, wherein an extension portion of the metal cap is in the air spacer; and
after the metal cap is formed, depositing a second etch stop layer over and contacting the dielectric layer, wherein the second etch stop layer is further over the second conductive feature, with a bottom surface of the second etch stop layer being exposed to the air spacer.

12. The method of claim 11, wherein a finishing time of forming the air spacer is after the second conductive feature has been formed.

13. The method of claim 11, wherein the forming the air spacer comprises:
forming a sacrificial spacer, wherein at a time after both of the sacrificial spacer and the second conductive feature are formed, the second conductive feature is encircled by the sacrificial spacer; and
removing the sacrificial spacer to form the air spacer.

14. The method of claim 13, wherein the sacrificial spacer is formed before the second conductive feature is formed.

15. The method of claim 11, wherein the air spacer penetrates through the first etch stop layer.

16. The method of claim 11, wherein no dielectric material is between the second conductive feature and the air spacer.

17. A method comprising:
forming a first conductive feature;
forming a second conductive feature over and electrically coupling to the first conductive feature, wherein the second conductive feature comprises:
a diffusion barrier; and
a metallic material in a basin formed by the diffusion barrier; and
removing at least a portion of a sacrificial layer encircling the second conductive feature to form an air spacer encircling at least a top portion of the second conductive feature; and
forming a metal cap over the second conductive feature, wherein a portion of the metal cap is exposed to the air spacer.

18. The method of claim 17, wherein the sacrificial layer is fully removed, and an entire outer sidewall of the second conductive feature is exposed to the air spacer.

19. The method of claim 17, wherein the sacrificial layer is partially removed, and a first bottom of the air spacer is higher than a second bottom of the second conductive feature.

20. The method of claim 17, wherein a portion of the metal cap comprises a lower portion lower than a top surface of the metal cap.

* * * * *